(12) United States Patent
Johnson et al.

(10) Patent No.: US 7,531,824 B1
(45) Date of Patent: May 12, 2009

(54) HIGH VALUE INDUCTOR WITH CONDUCTOR SURROUNDED BY HIGH PERMEABILITY POLYMER FORMED ON A SEMICONDUCTOR SUBSTRATE

(75) Inventors: Peter Johnson, Sunnyvale, CA (US); Peter J. Hopper, San Jose, CA (US); Kyuwoon Hwang, Palo Alto, CA (US); William French, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 103 days.

(21) Appl. No.: 11/274,932

(22) Filed: Nov. 14, 2005

(51) Int. Cl.
*H01L 29/02* (2006.01)
(52) U.S. Cl. .................. 257/2; 257/3; 257/4; 257/5
(58) Field of Classification Search ............. 257/1–5; 438/800, 900, 102–103
See application file for complete search history.

(56) References Cited

U.S. PATENT DOCUMENTS

| | | | | |
|---|---|---|---|---|
| 5,204,809 | A * | 4/1993 | Andresen | 363/132 |
| 5,869,148 | A * | 2/1999 | Silverschotz et al. | 427/549 |
| 6,867,903 | B2 * | 3/2005 | Imajuku et al. | 359/330 |
| 2002/0097129 | A1 * | 7/2002 | Johnson | 336/200 |

OTHER PUBLICATIONS

The Concise Colour Science Dictionary (Oxford University Press 1997), p. 708.*
The Periodic Table of the Elements, the International Union of Pure and Applied Chemistry (IUPAC), available at http://www.iupac.org/reports/periodic_table, Oct. 3, 2005.*
The Concise Colour Science Dictionary (Oxford University Press 1997).*
"Sustantially" Merriam-Webster Online Dictionary. 2008. http://www.merriam-webster.com (Jan. 22, 2008).*
"Completely" Merriam-Webster Online Dictionary. 2008. http://www.merriam-webster.com (Jan. 22, 2008).*
The Concise Colour Science Dictionary, p. 708 (Oxford University Press 1997).*
The Concise Colour Science Dictionary, p. 708 (Oxford University Press 1997.*
Johnson et al., U.S. Appl. No. 11/274,932 entitled "Apparatus and Method for Fabricating High Value Inductors on Semiconductor Integrated Circuits" filed Nov. 14, 2005.
Hopper et al., U.S. Appl. No. 11/041,658 entitled "Integrated Switching Voltage Regulator Using Copper Process Technology" filed Jan. 24, 2005.
U.S. Appl. No. 10/658,433 entitled "High Density Integrated Inductor with Core" filed Sep. 8, 2003.
Hwang et al., U.S. Appl. No. 11/111,660, "Patterned Magnetic Layer On-Chip Inductor" filed Apr. 21, 2005.

(Continued)

*Primary Examiner*—Jerome Jackson, Jr.
*Assistant Examiner*—Jami M Valentine
(74) *Attorney, Agent, or Firm*—Beyer Law Group LLP

(57) ABSTRACT

An apparatus and method for fabricating high value inductors embedded on semiconductor integrated circuit. The apparatus and method involve forming a conductor on the semiconductor substrate. Once the conductor is formed, a polymer material is provided on the substrate surrounding the conductor. The polymer material contains a ferromagnetic material so that the permeability of the polymer is greater than one. In various embodiments, the ferromagnetic material may be any one of a number of different high permeable materials such as iron oxide, zinc, manganese, zirconium, samarium (SA), neodymium (NA), cobalt, nickel or a combination thereof.

12 Claims, 6 Drawing Sheets

OTHER PUBLICATIONS

Johnson et al., U.S. Appl. No. 11/137,767 entitled Method of Improving On-Chip Power Inductor Performance in DC-DC Regulators filed May 25, 2005.

U.S. Appl. No. 11/495,143, filed Jul. 27, 2006.

U.S. Appl. No. 11/504,972, filed Aug. 15, 2006.

* cited by examiner

HIGH VALUE INDUCTOR WITH CONDUCTOR SURROUNDED BY HIGH PERMEABILITY POLYMER FORMED ON A SEMICONDUCTOR SUBSTRATE

BACKGROUND

1. Field of the Invention

The present invention relates to semiconductor integrated circuits, and more particularly, to an apparatus and method for fabricating high value inductors formed using ferromagnetic materials suspended in a polymer surrounding a conductor and embedded on a semiconductor integrated circuit.

2. Background of the Invention

Inductors are commonly used in the electronics industry for storing magnetic energy. An inductor is typically created by providing an electric current though a metal conductor, such as a metal plate or bar. The current passing though the metal conductor creates a magnet field or flux around the conductor. The amount of inductance is measured in terms of Henries. In the semiconductor industry, it is known to form inductors on integrated circuits. The inductors are typically created by fabricating what is commonly called an "air coil" inductor on the chip. The air coil inductor is usually either aluminum or some other metal patterned in a helical, toroidal or a "watch spring" coil shape. By applying a current through the inductor, the magnetic flux is created.

Inductors are used on chips for a number of applications. Perhaps the most common application is direct current to direct current or DC to DC switching regulators. In many situations, however, on chip inductors do not generate enough flux or energy for a particular application. When this occurs, very often an off-chip discrete inductor is used.

There are a number of problems in using off-chip inductors. Foremost, they tend to be expensive. With advances in semiconductor process technology, millions upon millions of transistors can be fabricated onto a single chip. With all these transistors, designers have been able to cram a tremendous amount of functionality onto a single chip and an entire system on just one or a handful of chips. Providing an off-chip inductor can therefore be relatively expensive. Off-chip inductors can also be problematic in situations where space is at a premium. In a cell phone or personal digital assistant (PDA) for example, it may be difficult to squeeze a discrete inductor into a compact package. As a result, the consumer product may not be as small or compact as desired.

An apparatus and method for fabricating high value inductors embedded on semiconductor integrated circuits is therefore needed.

SUMMARY OF THE INVENTION

An apparatus and method for fabricating high value inductors embedded on semiconductor integrated circuit. The apparatus and method involve forming a conductor on the semiconductor substrate. Once the conductor is formed, a polymer material is provided on the substrate surrounding the conductor. The polymer material contains a ferromagnetic material so that the permeability of the polymer is greater than one. In various embodiments, the ferromagnetic material may be any one of a number of different high permeable materials such as iron oxide, zinc, manganese, zirconium, samarium (SA), neodymium (NA), cobalt, nickel or a combination thereof.

BRIEF DESCRIPTION OF THE DRAWINGS

Like elements are designated by like reference numbers in the Figures.

DETAILED DESCRIPTION OF THE PREFERRED EMBODIMENTS

Figure 1:
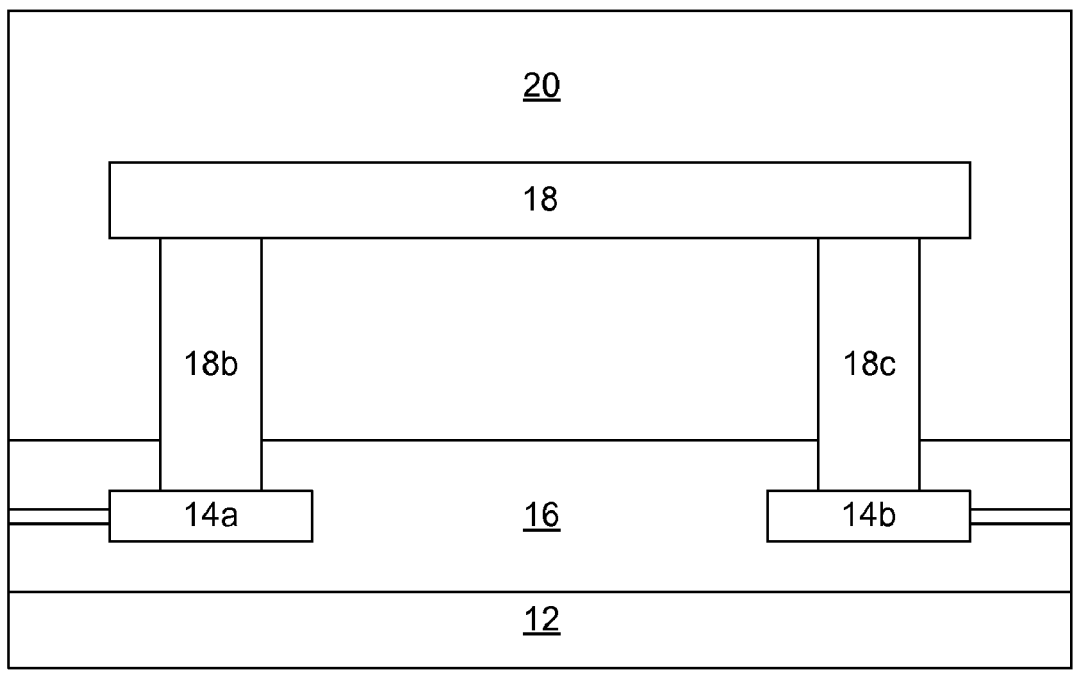
FIG. 1 is a cross section of a high value inductor fabricated on a semiconductor integrated circuit according to the present invention.
Figure 1:

Referring to FIG. 1, a cross section of a high value inductor 10 fabricated on a semiconductor substrate 12 is shown. A pair of bond pads 14a and 14b are formed in a standard interlevel dielectric layer 16 on the substrate 12. A conductor 18 is supported by two conductive posts 18a and 18b. The conductive posts 18a and 18b are electrically coupled to the bond pads 14a and 14b respectively. A high permeability polymer layer 20, which surrounds the conductor 18 and posts 18a and 18b, is used to form the inductor 10 and the substrate 12. The bond pads 14a and 14b are coupled to a switching node and a voltage output node of a switching regulator circuit (not shown) respectively.

According to various embodiments of the invention, the dielectric layer 16 is an oxide layer that is either deposited using a chemical vapor deposition or spun on. Alternatively, the dielectric layer 16 is a low K material such as SILK™ from Novellus or FLAIR™ from Dow Chemical. The conductor 18 and posts 18a and 18b can be formed from any type of metal, such as copper or aluminum. The high permeability polymer is a material such as BCB (Benzo Cyclo Butene) or "Su8" with a ferromagnetic material suspended therein. The "Su8" material is described in U.S. Pat. No. 4,882,245, incorporated by reference herein for all purposes. The ferromagnetic material may include particles from one or more of the following: iron oxide, zinc, manganese, zirconium, samarium (Sm), neodymium (Nd), cobalt, nickel, or a combination thereof. The inclusion of such a ferromagnetic material tends to raise the relative permeability of the polymer to at least one (1.0) or more, for example from one (1.0) to 1000. Together, the conductor 18 and the high permeability polymer create or form a high value inductor 10 on the substrate 12.

Referring to FIGS. 2A-2H, a series of semiconductor structures illustrating the fabrication sequence for forming the high value inductor 10 on a semiconductor substrate are shown.

Figure 2A:
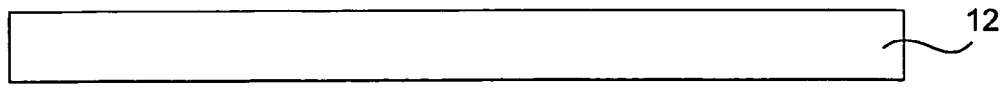
FIGS. 2A-2H are a series of semiconductor structures illustrating the fabrication sequence for forming high value inductors on a semiconductor integrated circuit according to the present invention.

Referring to FIG. 2A, a cross section of the semiconductor substrate 12 is shown. Although the cross section shows the substrate 12 for just a single inductor 10, it should be understood that the process described below can be used to fabricate a plurality of inductors on a semiconductor wafer. However, for the sake of simplicity only the single inductor 10 is shown.

Figure 2B:
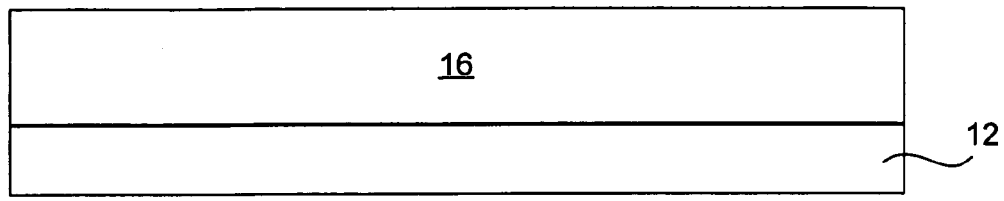

Referring to FIG. 2B, the dielectric layer 16 is shown formed on the substrate 12. In various embodiments, the dielectric layer 16 is 0.5 to 3 microns thick. Also as previously noted, the dielectric layer 16 can be an oxide that is grown using chemical vapor deposition or spun on. Alternatively, the dielectric layer 16 can be a low K material as mentioned above.

Figure 2C:
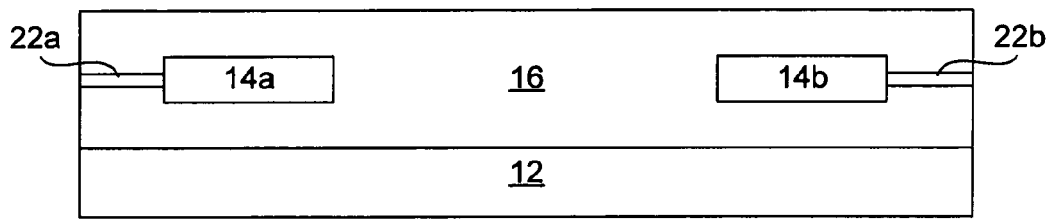

Referring to FIG. 2C, bond pads 14a and 14b are shown formed in the dielectric layer 16. The bond pads 14a and 14b are fabricated using standard semiconductor metallization techniques. The two bond pads 14a and 14b are coupled to metal traces 22a and 22b which later couple the inductor 10 to a switching node and a voltage output node of a voltage regulator circuit (not shown) respectively.

Figure 2D:
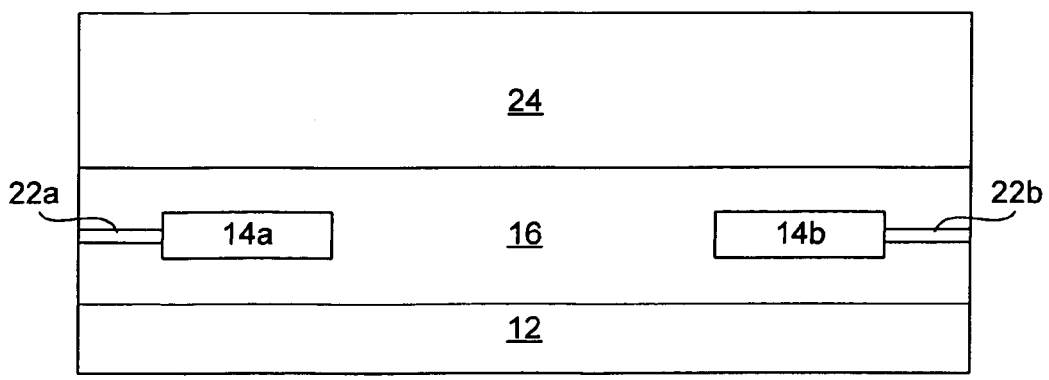

Referring to FIG. 2D, a sacrificial layer 24 is shown formed on the dielectric layer 16. In various embodiments, the sacrificial layer ranges in thickness from 20 to 500 microns. The sacrificial layer is made from an organic material, such as in various embodiments BCB, polymide, parylene or photoresist respectively.

Figure 2E:
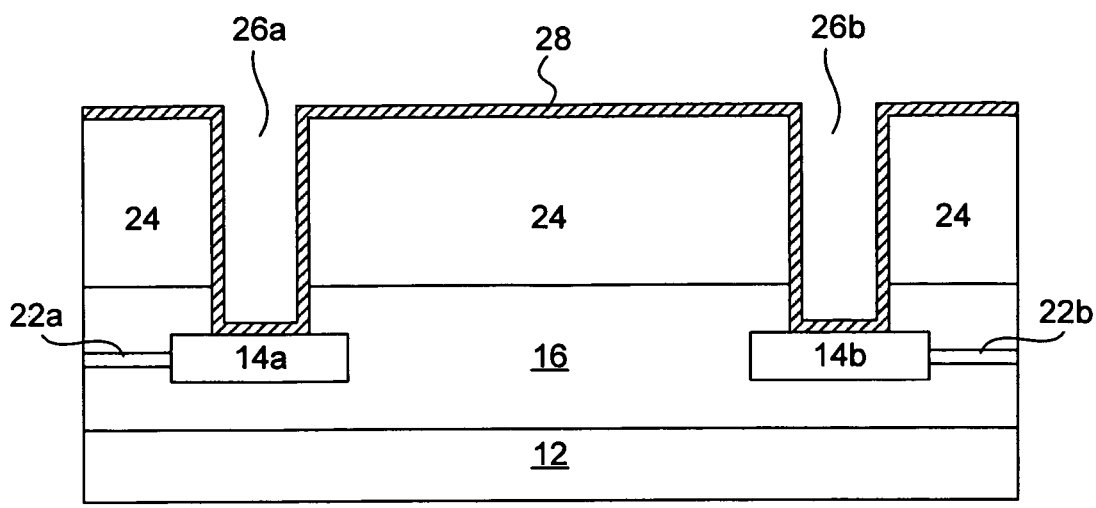

Referring to FIG. 2E, the sacrificial layer 24 is shown patterned to form two vias 26a and 26b using standard photolithography techniques. Alternatively, if the material used to form the sacrificial layer 24 is photoactive, the sacrificial layer 24 may be masked and developed. The non-exposed portions are then removed to form the vias 26a and 26b.

Once the sacrificial layer 24 is patterned, a seed layer 28 created over the sacrificial layer 24. As evident in the figure, the seed layer 28 is formed across the surface of the sacrificial layer 24 and into the vias 26a and 26b. In one embodiment, the seed layer is actually a copper layer sandwiched between two titanium layers. The seed layer 28 is formed using conventional processing techniques such as sputtering, chemical vapor deposition, or e-beam evaporation.

Figure 2F:
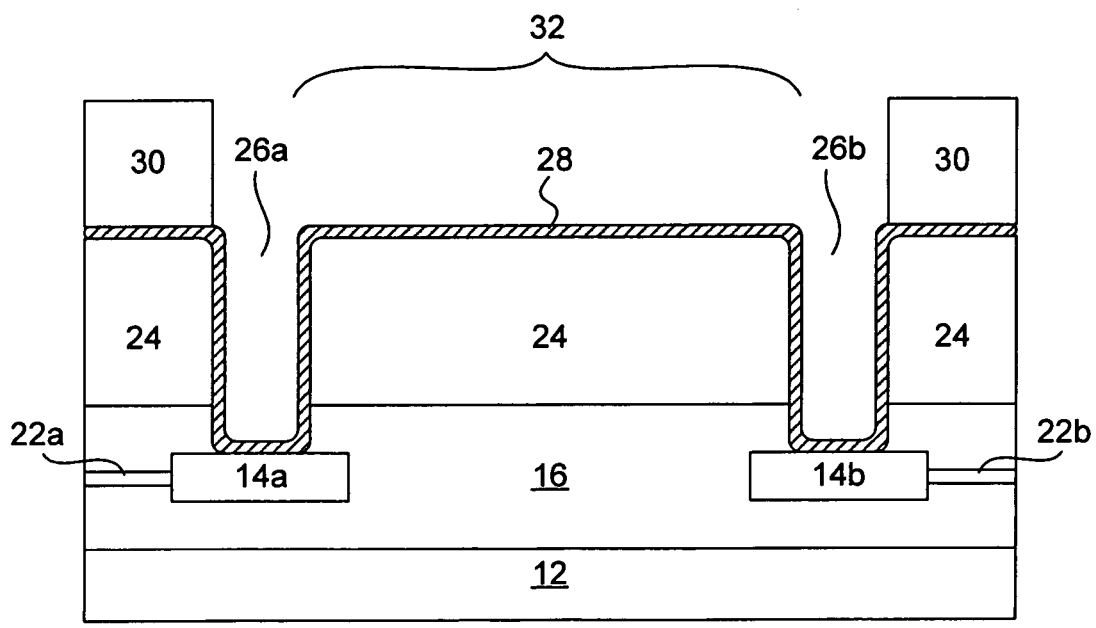

Referring to FIG. 2F, a patterned resist layer 30 is formed over the seed layer 28. Initially, the resist layer 30 is formed over the entire seed layer 28. Using conventional semiconductor process techniques, the resist layer 30 is patterned to create an opening 32, exposing the seed layer 28 on the sacrificial layer 24 and within the vias 26a and 26b.

Figure 2G:
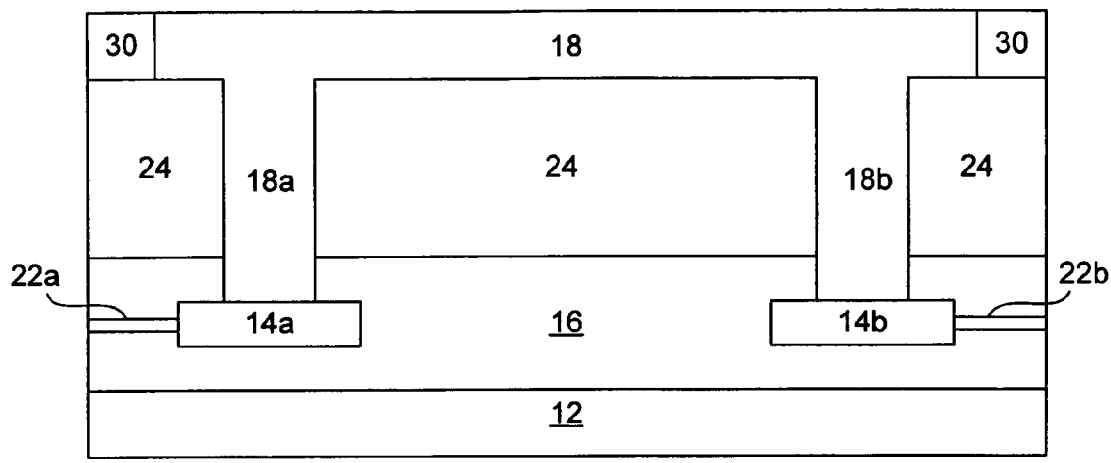

Referring to FIG. 2G, the conductor 18 including posts 18a and 18b are formed. The conductor 18 is formed by applying a plating voltage and placing the substrate (e.g., wafer) 12 into an electrolytic bath. In one embodiment, the metal provided in the plating solution is copper. In other embodiments, other well known plating metals may be used such as gold or aluminum. The plating takes place for a sufficient period of time to form the posts 18a and 18b and conductor 18 on the seed layer 28.

Figure 2H:
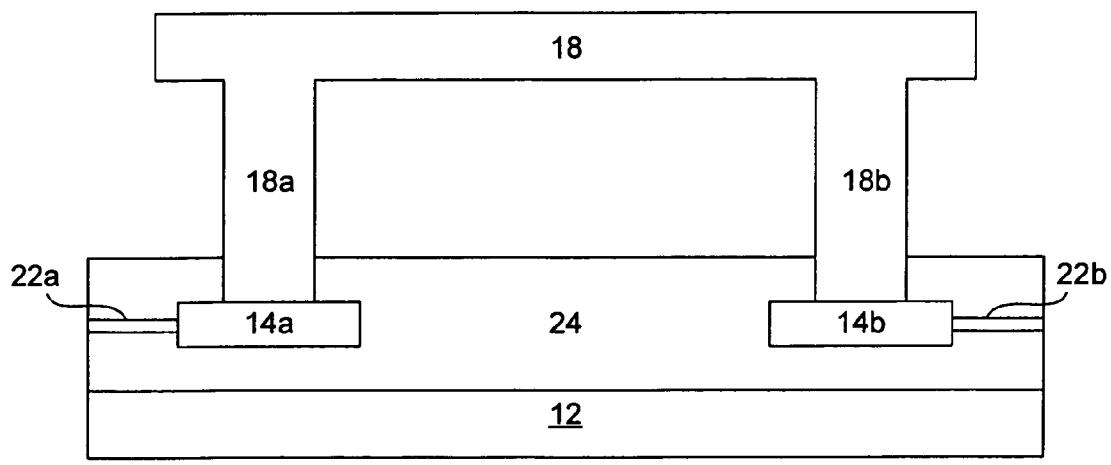

Referring to FIG. 2H, the inductor 10 is shown with the sacrificial layer 24 and resist layer 30 removed. In various embodiments, these two layers 24 and 30 are removed using an oxygen plasma or an organic solvent such as acetone. Once the layers are removed, the conductor 18 and posts 18a and 18b are left free standing on the substrate 12.

In a final step, the polymer 20 is formed on the dielectric layer 16 on substrate 12. In various embodiments, the polymer layer 20 is applied by using a spin-on process or a silk-screen process. After the application, the polymer layer in one embodiment surrounds the conductor 18 and the exposed portion of the posts 18a and 18b. Since the polymer 20 includes a ferromagnetic material, it increases the relative permeability of the material to greater than one (1.0). As a result, a high value inductor is formed. In various embodiments, the relative permeability of the polymer may range from one 1.0 to 1000.

Figure 3:
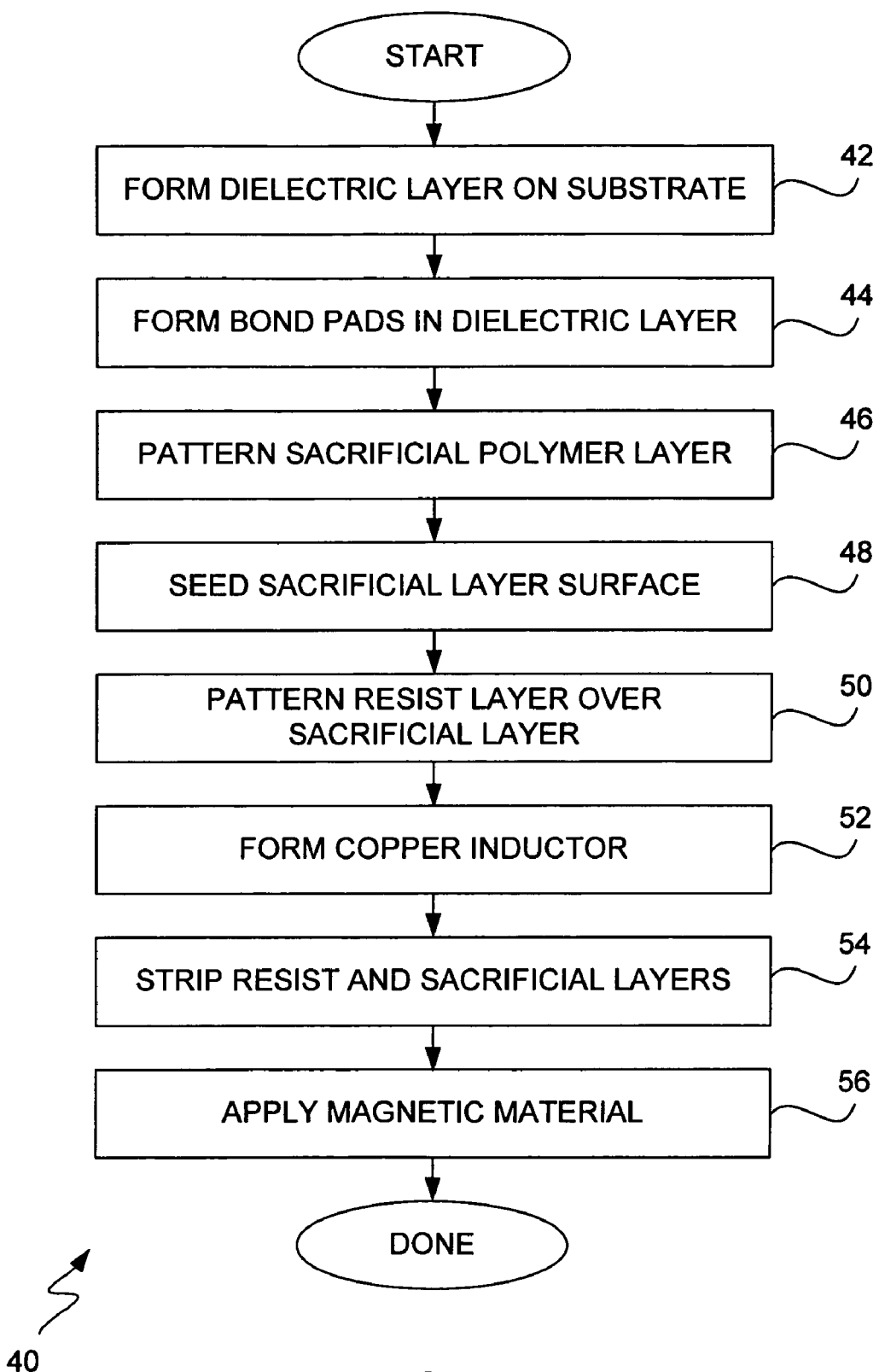
FIG. 3 is a flow chart illustrating the processing sequence of the present invention.

Referring to FIG. 3, a flow chart 40 illustrating the process sequence of the present invention is shown. In the initial step, the dielectric layer 16 is formed on the substrate 12 (box 42). As previously noted, the dielectric layer 16 can be either an oxide that is grown or spun on, or a low K material. In the next step (box 44), bond pads 14a and 14b are formed in the dielectric layer 16 using conventional metallization techniques. A sacrificial polymer layer 24 is then formed and patterned on the dielectric layer 16 (box 46). The layer 24 is next patterned to form the vias 26a and 26b which are later used for defining the posts 18a and 18b respectively. A seed layer 28, typically a titanium-copper-titanium sandwich, is formed on the sacrificial layer. The seed layer 28 is used to attract or "seed" the metal forming conductor 18 and posts 18a and 18b during plating (box 48). A resist layer 30 is then formed and patterned over the seed layer 28 (box 50). The patterned resist layer is used to define the formation of the conductor 18 during plating. In box 52, a voltage is applied to the substrate 12 and the substrate is submerged in a plating bath. As a result, the conductor 18 and posts 18a and 18b are formed. The resist layer 30 and the sacrificial layer 16 are then removed (box 54). In the final step (box 56), the high permeable (i.e. magnetic) polymer 20 is provided onto the dielectric layer 16. As illustrated in the figures, the polymer layer 20 surrounds the conductor 18, forming a high value inductor 10 on the substrate 12.

Figure 4:
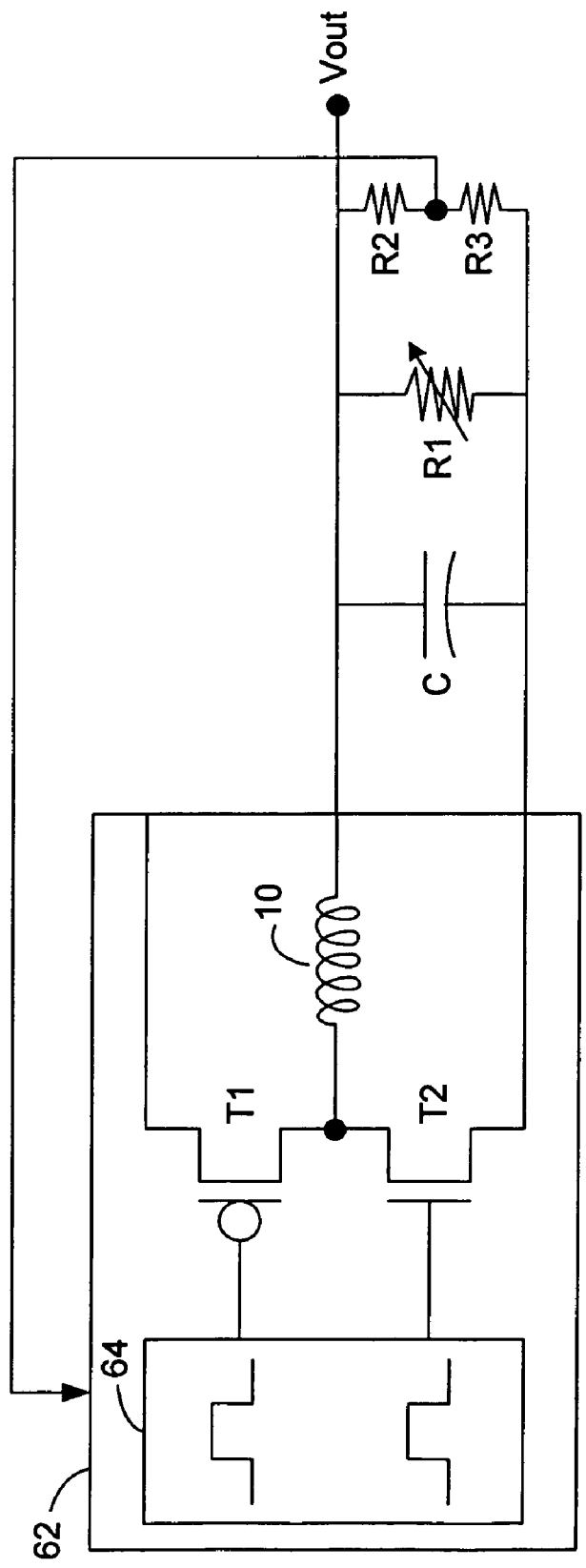
FIG. 4 is a diagram illustrating a power controller chip having the high value inductor fabricated thereon in accordance with the present invention.

Referring to FIG. 4, a diagram illustrating a power control system is disclosed. The power control system 60 is used to supply power to a load, such as a microprocessor or a printed circuit board containing one or more integrated circuits and other components. In the system 60, the load is represented by a variable resistor R1. The capacitor C represents a smoothing capacitor. Resistors R2 and R3 represent the voltage error sensing resistors. The system 60 also includes a power controller chip 62. The power controller chip 62 includes the high value inductor 10 as described above, two power output transistors T1 and T2, and power control circuitry 64. The inductor 10 is coupled between a $V_{out}$ node and a switching node (i.e. the bond pad 14a is coupled to the switching node between transistors T1 and T2 and the bond pad 14b is coupled between resistors R2 and R3.

The objective of the power controller chip 62 is to maintain $V_{out}$ as constant as possible. If the voltage $V_{out}$ drops during operation, the power control circuitry 64 generates pulses to drive transistor T1 on harder, faster and longer. As a result, the inductor 10 stores more energy, causing the voltage of $V_{out}$ to be pulled up (i.e. remain constant). Alternatively, if $V_{out}$ drifts or is pulled too high, the power control circuitry 64 will drive transistor T2 on harder, faster and longer. As a result, the inductor 10 will store less energy, causing $V_{out}$ to be reduced. In this manner, the voltage $V_{out}$ remains relatively steady. The high value inductor 10 thus eliminates the need to use a discrete high value inductor. Instead, by using the high value inductor 10 of the present invention, the entire power control system can be integrated onto a single chip.

While this invention has been described in terms of several preferred embodiments, there are alteration, permutations, and equivalents, which fall within the scope of this invention. It should also be noted that there are many alternative ways of implementing the methods and apparatuses of the present invention. For example, the steps of the present invention may be used to form a plurality of high value inductors 10 across many die on a semiconductor wafer. It is therefore intended that the following appended claims be interpreted as including all such alterations, permutations, and equivalents as fall within the true spirit and scope of the present invention.

What is claimed is:

1. An apparatus, comprising
a semiconductor substrate;
a conductor formed on the semiconductor substrate, wherein said conductor includes a plurality of electrical contacts coupled thereto; and
a polymer material substantially surrounding the conductor at all locations except for those locations where said plurality of electrical contacts are coupled to said conductor, the polymer material having a ferromagnetic material embedded and substantially suspended therein and throughout said entire polymer material such that the polymer has a magnetic permeability that is greater than one, whereby the conductor is substantially surrounded by polymer material having a magnetic permeability that is greater than one.

2. The apparatus of claim 1, wherein the ferromagnetic material is held in suspension in the polymer.

3. The apparatus of claim 1, wherein the ferromagnetic material is a powder mixed into the polymer material.

4. The apparatus of claim 1, wherein the ferromagnetic material consists of one of the following: iron oxide, manganese, zinc, zirconium, samarium (Sm), neodymium (Nd), cobalt, nickel, or a combination thereof.

5. The apparatus of claim 1, wherein the conductor consists of one of the following electrically conductive materials: copper, aluminum or gold.

6. The apparatus of claim 1, further comprising a dielectric layer formed between the conductor surrounded by the polymer material and the substrate.

7. The apparatus of claim 6, wherein the dielectric layer consists of one of the following: oxide or a low K dielectric material.

8. The apparatus of claim 1, wherein said conductor is embedded within said polymer material, such that said polymer material substantially surrounds the conductor in all directions.

9. An apparatus, comprising
a semiconductor substrate;
a conductor formed on the semiconductor substrate;
a polymer material substantially surrounding the conductor, the polymer material having a ferromagnetic material embedded and substantially suspended therein and throughout said entire polymer material such that the polymer has a magnetic permeability that is greater than one, whereby the conductor is substantially surrounded by polymer material having a magnetic permeability that is greater than one;
two bond pads formed on the semiconductor substrate; and
two conductive posts electrically coupling the conductor and the two bond pads respectively.

10. The apparatus of claim 9, wherein the first bond pad is connected to a switching node and the second bond pad is connected to a voltage output node of a voltage regulator.

11. The apparatus of claim 9, wherein the two conductive posts extend from the two bond pads and through the polymer material to contact the conductor surrounded by the polymer material.

12. A semiconductor device, comprising
a semiconductor substrate;
an electrical conductor formed on the semiconductor substrate, said electrical conductor having a plurality of electrical contacts coupled thereto; and
a polymer material completely surrounding the electrical conductor at all locations except for those locations where said plurality of electrical contacts are coupled to said conductor, the polymer material having a ferromagnetic material embedded therein and throughout said entire polymer material such that the polymer material has a magnetic permeability that is greater than one, wherein the electrical conductor is substantially surrounded in all directions by polymer material having a magnetic permeability that is greater than one.

* * * * *